US012133361B2

(12) United States Patent
Patel (10) Patent No.: US 12,133,361 B2
(45) Date of Patent: Oct. 29, 2024

(54) RACK-BASED MANAGEMENT OF LEAKS IN LIQUID COOLED INFORMATION HANDLING SYSTEMS

(71) Applicant: Dell Products, L.P., Round Rock, TX (US)

(72) Inventor: Bhavesh Govindbhai Patel, Austin, TX (US)

(73) Assignee: Dell Products, L.P., Round Rock, TX (US)

(*) Notice: Subject to any disclaimer, the term of this patent is extended or adjusted under 35 U.S.C. 154(b) by 223 days.

(21) Appl. No.: 17/812,189

(22) Filed: Jul. 13, 2022

(65) Prior Publication Data

US 2024/0023276 A1 Jan. 18, 2024

(51) Int. Cl.
*H05K 7/20* (2006.01)
*G06F 1/20* (2006.01)
*G06F 9/50* (2006.01)

(52) U.S. Cl.
CPC ........... *H05K 7/20272* (2013.01); *G06F 1/20* (2013.01); *G06F 9/5088* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,968,010 B2* | 5/2018 | Shelnutt | ............. | H05K 7/20781 |
| 10,010,013 B2* | 6/2018 | Shelnutt | ............. | H05K 7/20781 |
| 10,156,873 B2* | 12/2018 | Shelnutt | ............. | H05K 7/20809 |
| 10,206,312 B2* | 2/2019 | Shelnutt | ............... | H05K 7/2079 |
| 10,617,042 B2* | 4/2020 | Shelnutt | ............. | H05K 7/20772 |
| 10,729,039 B2* | 7/2020 | Shelnutt | ............. | H05K 7/20763 |
| 10,917,998 B2* | 2/2021 | Shelnutt | ............. | H05K 7/20772 |
| 11,252,844 B2* | 2/2022 | Shao | ..................... | H05K 7/1489 |
| 11,310,938 B2* | 4/2022 | Su | ......................... | G01M 3/183 |
| 11,346,741 B2* | 5/2022 | Curtis | ..................... | G01M 3/22 |
| 11,553,627 B1* | 1/2023 | Gregory | ............. | H05K 7/20781 |
| 11,589,476 B2* | 2/2023 | Ma | ...................... | H05K 7/20236 |
| 11,592,795 B2* | 2/2023 | Farkas | .................. | F04C 11/001 |
| 11,725,890 B2* | 8/2023 | Holden | .............. | H05K 7/20272 |
| | | | | 165/11.1 |
| 11,729,946 B2* | 8/2023 | Gao | .................... | H05K 7/20272 |
| | | | | 361/679.53 |
| 11,737,233 B2* | 8/2023 | Gao | .................... | H05K 7/20272 |
| | | | | 361/679.02 |

(Continued)

OTHER PUBLICATIONS

Alaric J. Silveira, et al., "Liquid Cooling Leakage Abatement System and Method of Using the Same," U.S. Appl. No. 17/492,829, filed Oct. 4, 2021, 38 pages.

*Primary Examiner* — Lisa Lea-Edmonds
(74) *Attorney, Agent, or Firm* — Fogarty LLP (57) ABSTRACT

Systems and methods for rack-based management of leaks in liquid cooled Information Handling Systems (IHSs) are described. In an illustrative, non-limiting embodiment, an IHS configured as head node of a rack may include a processor and a memory coupled to the processor, the memory having program instructions stored thereon that, upon execution, cause the IHS to: receive an indication of a leak from a compute node; identify a location of the compute node in the rack; and respond to the indication based, at least in part, upon the location.

17 Claims, 3 Drawing Sheets

(56) References Cited

U.S. PATENT DOCUMENTS

| | | | | |
|---|---|---|---|---|
| 11,737,247 B2* | 8/2023 | Edmunds | | H05K 7/203 361/699 |
| 11,751,359 B2* | 9/2023 | Heydari | | H05K 7/20272 361/699 |
| 11,758,693 B2* | 9/2023 | Gao | | H05K 7/20781 361/699 |
| 11,778,777 B2* | 10/2023 | Gao | | H05K 7/20781 361/679.53 |
| 11,778,790 B2* | 10/2023 | Edmunds | | H05K 7/20236 361/679.46 |
| 11,800,681 B2* | 10/2023 | Gao | | H05K 7/20272 |
| 11,882,678 B2* | 1/2024 | Miyamura | | H05K 7/20281 |
| 11,895,809 B2* | 2/2024 | Heydari | | H05K 7/20772 |
| 11,906,218 B2* | 2/2024 | Shedd | | H01L 23/4735 |
| 11,910,575 B2* | 2/2024 | Gao | | H05K 7/20272 |
| 11,937,401 B2* | 3/2024 | Gao | | H05K 7/20272 |
| 2016/0270259 A1* | 9/2016 | Chainer | | H05K 7/20272 |
| 2017/0181329 A1* | 6/2017 | Shelnutt | | H05K 7/20781 |
| 2020/0146188 A1* | 5/2020 | Shelnutt | | H05K 7/20781 |
| 2020/0256341 A1* | 8/2020 | Farkas | | G05B 19/042 |
| 2020/0378858 A1* | 12/2020 | Curtis | | F17D 5/06 |
| 2022/0046828 A1* | 2/2022 | Miyamura | | H05K 7/20763 |
| 2022/0071049 A1* | 3/2022 | Heydari | | H05K 7/2079 |
| 2022/0390195 A1* | 12/2022 | Gao | | F28F 27/02 |
| 2023/0039781 A1* | 2/2023 | Mohajer | | H05K 7/20272 |
| 2023/0061298 A1* | 3/2023 | Gao | | G01M 3/38 |
| 2023/0063710 A1* | 3/2023 | Gao | | H05K 7/20509 |
| 2023/0067118 A1* | 3/2023 | Gao | | G01M 3/18 |
| 2023/0067321 A1* | 3/2023 | Gao | | H05K 7/20272 |
| 2023/0068535 A1* | 3/2023 | Chen | | G06F 1/20 |
| 2023/0109137 A1* | 4/2023 | Silveira | | G06Q 30/0283 700/282 |
| 2023/0284422 A1* | 9/2023 | Heydari | | H05K 7/20272 361/679.53 |
| 2023/0324964 A1* | 10/2023 | Montgomery | | H05K 7/20263 361/699 |
| 2023/0341198 A1* | 10/2023 | Holden | | H05K 7/20254 |
| 2023/0363116 A1* | 11/2023 | Heydari | | H05K 7/20836 |
| 2023/0363117 A1* | 11/2023 | Gupta | | H05K 7/20272 |
| 2023/0413474 A1* | 12/2023 | Clark | | H05K 7/20772 |
| 2024/0011809 A1* | 1/2024 | Curtis | | G01F 1/075 |
| 2024/0015890 A1* | 1/2024 | White | | H05K 1/0272 |
| 2024/0023276 A1* | 1/2024 | Patel | | H05K 7/20272 |
| 2024/0032243 A1* | 1/2024 | Matteson | | H05K 7/20263 |
| 2024/0049434 A1* | 2/2024 | Mohajer | | H05K 7/20254 |

* cited by examiner

RACK-BASED MANAGEMENT OF LEAKS IN LIQUID COOLED INFORMATION HANDLING SYSTEMS

FIELD

This disclosure relates generally to Information Handling Systems (IHSs), and more specifically, to systems and methods for rack-based management of leaks in liquid cooled IHSs.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Systems and methods for rack-based management of leaks in liquid cooled Information Handling Systems (IHSs) are described. In an illustrative, non-limiting embodiment, an IHS configured as head node of a rack may include a processor and a memory coupled to the processor, the memory having program instructions stored thereon that, upon execution, cause the IHS to: receive an indication of a leak from a compute node; identify a location of the compute node in the rack; and respond to the indication based, at least in part, upon the location.

The rack may include a chassis having a plurality of compute nodes vertically stacked in trays or slots, and each tray or slot may include a different location in the rack. The compute node may include one or more liquid-cooled or immersion-cooled components.

The indication may be received over a management network from a Baseband Management Controller (BMC) of the compute note. To identify the location of the compute node, the program instructions, upon execution, may cause the IHS to: determine an Internet Protocol (IP) address of the BMC; and identify the location based, at least in part, upon a table that relates IP addresses to different rack locations.

To respond to the indication, the program instructions, upon execution, may cause the IHS to trigger a shutdown of the compute node. Additionally, or alternatively, to respond to the indication, the program instructions, upon execution, may cause the IHS to trigger a shutdown of another compute node below the compute node in the rack. Additionally, or alternatively, to respond to the indication, the program instructions, upon execution, may cause the IHS to trigger a shutdown of a number of compute nodes below the compute node in the rack, where the number is selected based, at least in part, upon a severity of the leak.

Additionally, or alternatively, to respond to the indication, the program instructions, upon execution, may further cause the IHS to trigger a migration of a workload executed by the compute node to another compute node above the compute node in the rack. The program instructions, upon execution, may further cause the IHS to at least one of: (a) trigger a migration of another workload executed by the other compute node to yet another compute node in the rack; or (b) reschedule execution of the other workload.

Additionally, or alternatively, to respond to the indication, the program instructions, upon execution, may cause the IHS to trigger a migration of a workload executed by the compute node to another compute node below the compute node in the rack. A distance between another location of the other compute node and the location of the compute node may be selected based, at least in part, upon a priority of the workload. Additionally, or alternatively, the distance between another location of the other compute node and the location of the compute node may be selected based, at least in part, upon a severity of the leak.

In some cases, to respond to the indication, the program instructions, upon execution, may further cause the IHS to trigger a migration of a workload executed by the compute node to another compute node in another rack.

In another illustrative, non-limiting embodiment, in an IHS configured as head node in a rack, a method may include: receiving an indication of a leak from a BMC of a compute node; identifying a location of the compute node in the rack; and reallocating execution of a workload by the compute node to another compute node based in the rack based, at least in part, upon the location.

The other compute node may be selected above the compute node in the rack. Alternatively, the other compute node may be selected below the compute node, and a distance between another location of the other compute node and the location of the compute node is based, at least in part, upon at least one of: a priority of the workload, or a severity of the leak.

In yet another illustrative, non-limiting embodiment, a memory storage device may have program instructions stored thereon that, upon execution by an IHS, cause the IHS to: receive an indication of a leak from a compute node; identify a location of the compute node in the rack; and respond to the indication based, at least in part, upon the location.

The other compute node may be selected above the compute node in the rack. Alternatively, the other compute node may be selected below the compute node, and a distance between another location of the other compute node and the location of the compute node may be based, at least in part, upon a priority of the workload and a severity of the leak.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

In recent years, the amount of heat produced by various IHS components has increased significantly. During normal operation, these components must be kept within temperature specifications to avoid overheating, instability, malfunction, or damage that otherwise leads to shortened lifespans.

A typical approach for controlling the temperature of an IHS component is to use a fan or air blower that rejects heat by driving cool air around the component (e.g., around a heat sink coupled to the IHS component). Another approach includes liquid cooling, where a heat-exchanging cold plate is coupled to the IHS component, and a chilled fluid is circulated through conduits internal to the cold plate to remove heat from that component. Yet another approach may include immersion cooling, whereby an IHS component in submerged in a cooled liquid and cooled by convection.

As the inventors hereof have recognized, a drawback of liquid or immersion cooling is that various fluid fittings, fluid joints, hoses or other fluidic conduits, pumps, cold plates, etc., have a propensity to develop leaks due to vibration, thermal cycles, and/or aging. While liquid and immersion cooling can provide benefits such as reduced power consumption, noise reduction, and increased space utilization, the costs associated with leaks often include hardware losses and workload interruptions.

In conventional implementations, a liquid or immersion cooled IHS may include leak sensors configured to detect and report leaks. In a computing rack that houses a plurality of IHSs (e.g., blades or "nodes"), however, rack-level mechanisms for detecting, estimating, notifying, remediating, or responding to leaks in individual IHSs are lacking. To address these, and other concerns, systems and methods for rack-based management of leaks in liquid cooled IHSs are described.

Figure 1:
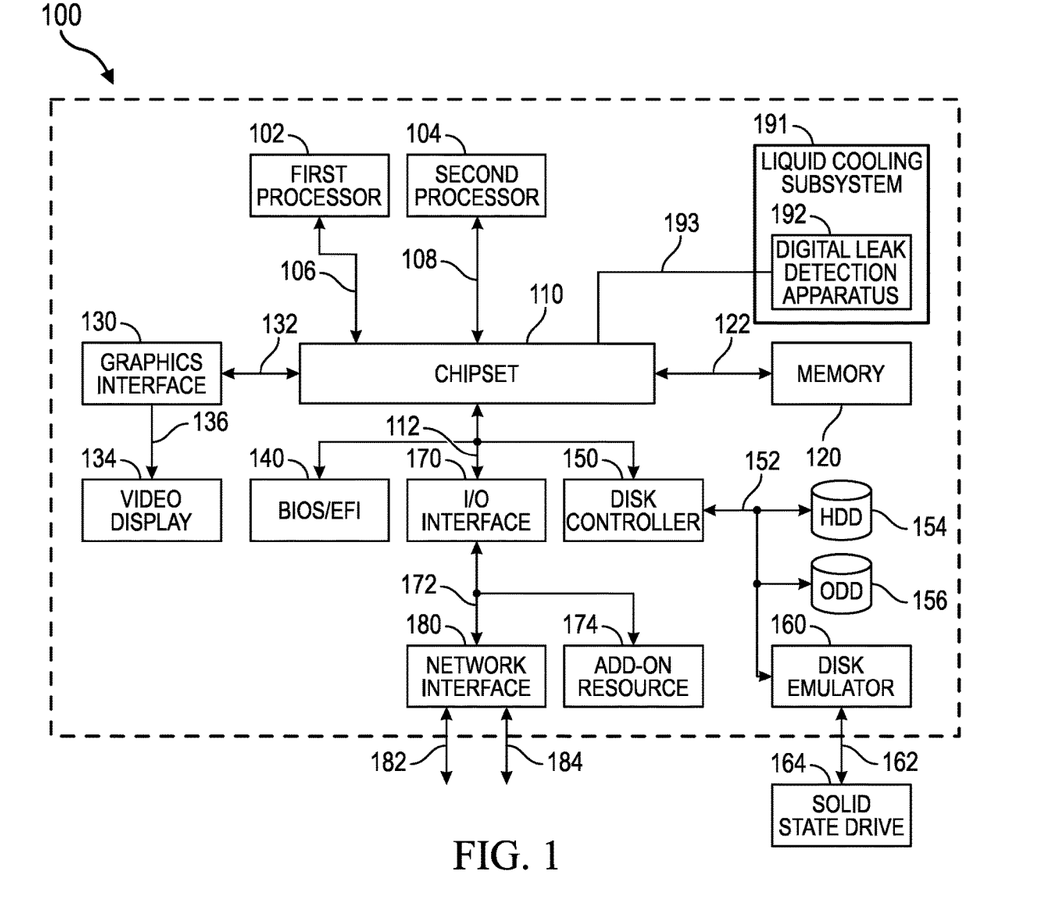
FIG. 1 is a block diagram illustrating an example of components of an Information Handling System (IHS), according to some embodiments.

FIG. 1 illustrates an example of components of IHS 100. Particularly, IHS 100 may include devices, components, or modules that embody one or more of the systems and/or performs one or more of the methods described herein. As shown, IHS 100 includes processors 102 and 104, chipset 110, memory 120, graphics interface 130, basic input and output system/extensible firmware interface (BIOS/EFI) module 140, disk controller 150, disk emulator 160, input/output (I/O) interface 170, network interface 180, and liquid cooling subsystem 191.

Processor 102 is connected to chipset 110 via processor interface 106, and processor 104 is connected to chipset 110 via processor interface 108. In some cases, processor 102 may be a host processor. Processor 104 may be a Baseboard Management Controller (BMC) configured to report leaks detected by digital leak detection apparatus 192 of liquid cooling subsystem 19 to a rack's head node (e.g., 204). An example of a BMC is the integrated Dell Remote Access Controller (iDRAC) from DELL.

Memory 120 is connected to chipset 110 via memory bus 122. Graphics interface 130 is connected to chipset 110 via a graphics interface 132 and provides video display output 136 to video display 134. In a particular embodiment, IHS 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within IHS 100, to provide drivers for the resources, initialize the resources, and access the resources. BIOS/EFI module 140 includes code that operates to detect resources within IHS 100, to provide drivers for the resources, to initialize the resources, and to access the resources.

Disk controller 150 includes disk interface 152 that connects the disc controller to hard disk drive (HDD) 154, to optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits solid-state drive 164 to be connected to IHS 100 via external interface 162. Examples of external interface 162 include a USB interface, an IEEE 1194 (Firewire) interface, a proprietary interface, or a combination thereof. Alternatively, solid-state drive 164 may be disposed within IHS 100.

I/O interface 170 includes peripheral interface 172 that connects the I/O interface to add-on resource 174 and to network interface 180. Peripheral interface 172 may be the same type of interface as I/O channel 112 or a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type.

Add-on resource 174 can include a data storage system, an additional graphics interface, a network interface card (NIC), a sound/video processing card, another add-on resource, or a combination thereof. Add-on resource 174 may be on a main circuit board, on separate circuit board or add-in card disposed within IHS 100, a device that is external to the information handling system, or a combination thereof.

Network interface 180 represents a NIC disposed within IHS 100 on a main circuit board of IHS 100, integrated onto another component such as chipset 110, in another suitable location, or a combination thereof. Network interface device 180 includes network channels 182 and 184 that provide interfaces to devices that are external to IHS 100. In a particular embodiment, network channels 182 and 184 are of a different type than peripheral channel 172 and network interface 180 translates information from a format suitable to the peripheral channel to a format suitable to external devices.

Examples of network channels 182 and 184 include InfiniBand channels, Fibre Channel channels, Gigabit Ethernet channels, proprietary channel architectures, or a combination thereof. Network channels 182 and 184 may be connected to external network resources (not illustrated). The network resource can include another IHS, a data storage system, another network, a grid management system, another suitable resource, or a combination thereof.

Liquid cooling subsystem 191 comprises leak detection apparatus 192. Digital leak detection apparatus 192 is connected to chipset 110 via interface 193, and it is configured to communicate leak detection indications or messages to BMC 104.

In some embodiments, leak detection apparatus 192 may include a circuit board having moisture sensors that use exposed electrical traces, which can be assessed using a digital signal processing (DSP) or Microcontroller Unit (MCU) of liquid cooling subsystem 191 to detect leaks. A first microstrip differential trace sensing element may be fabricated and placed in an area prone to leaks (e.g., near hose fittings, near a drain of a drip tray, etc.). In the presence of water, the impedance of the first microstrip differential trace sensing element changes.

To cancel out variations in: (i) component and board manufacturing, and (ii) humidity changes in the environment, a second microstrip differential trace sensing element may be provided and used as a reference. In contrast with the first trace sensing element, the second trace sensing element may be placed where leaks are not expected.

In liquid cooling subsystem 191, one or more analog-to-digital converters (ADCs) may sample voltages on the first and second trace sensing elements. Firmware (FW) is executed by the DSP or MCU to monitor the change of peak voltages that correlate to impedances. The DSP or MCU may compare readings between trace sensing elements, and it may assert an alert if there is a leak (e.g., indicated by a difference between the voltages of the first and second trace sensing elements being greater than a threshold value).

In some embodiments, IHS 100 may not include all the components shown in FIG. 1. In other embodiments, IHS 100 may include other components in addition to those that are shown in FIG. 1. Furthermore, some components that are represented as separate components in FIG. 1 may instead be integrated with other components. For example, all or a portion of the operations executed by the illustrated components may instead be executed by components integrated into processor(s) 101 as systems-on-a-chip (SoC). As such, in certain embodiments, IHS 100 may be implemented as different classes of computing devices including, but not limited to: servers, workstations, desktops, laptops, appliances, video game consoles, tablets, smartphones, etc.

Figure 2:
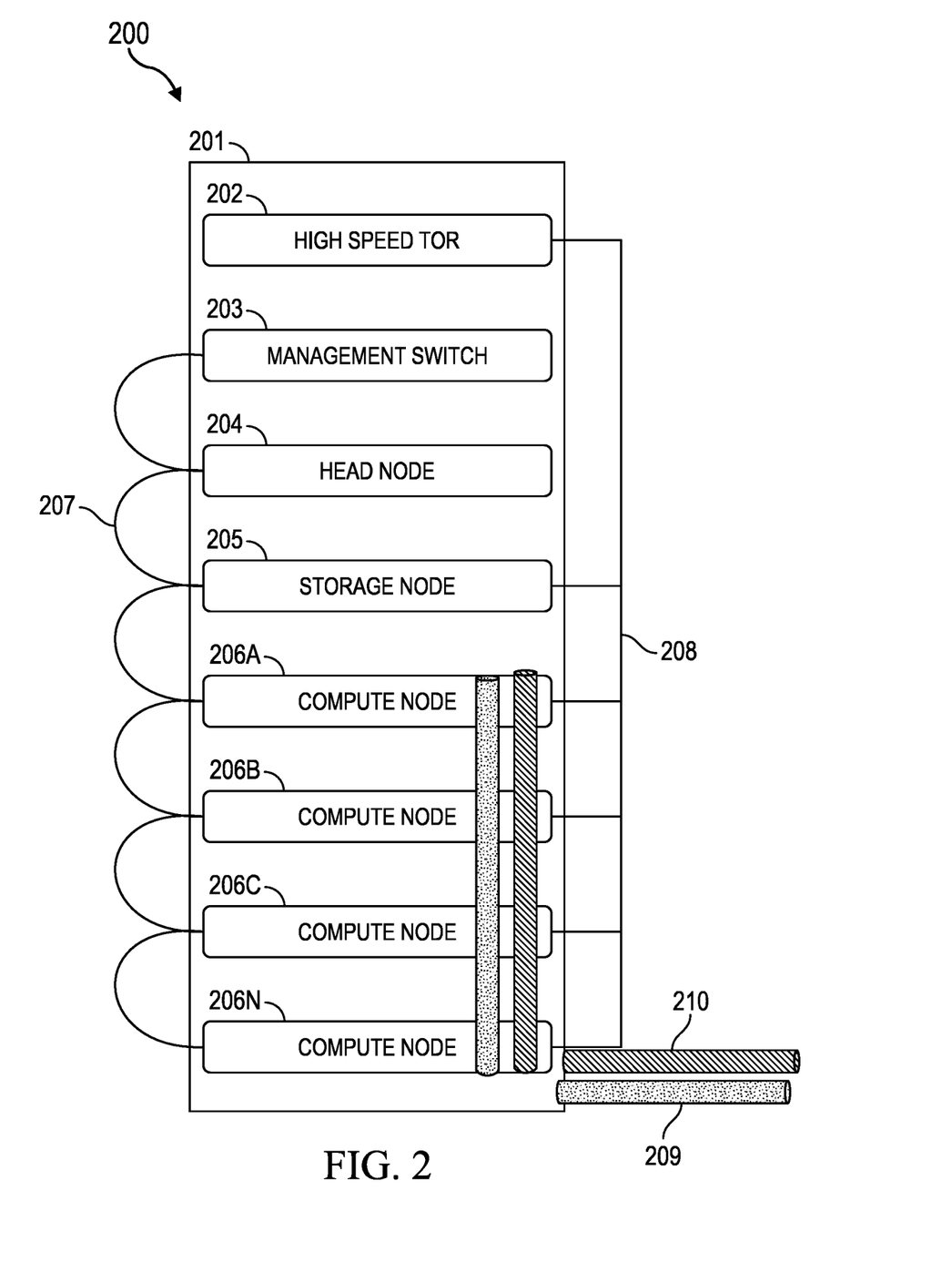
FIG. 2 is a block diagram illustrating an example of a rack configured to manage leak detection in liquid cooled IHSs, according to some embodiments.

FIG. 2 is a block diagram illustrating an example of rack 100 configured to manage leak detection in liquid cooled IHSs 206A-N ("compute nodes"). In some embodiments, rack 200 may be part of a datacenter. The term "datacenter," as used herein, refers to any number of racks disposed within a same physical location, such as a room or a building, often interconnected to provide one or more services to users or customers of the datacenter.

In this example, rack 200 holds, from top to bottom of its enclosure, chassis, or housing 201: high speed Top-of-Rack (ToR) switch 202, management switch 203, head node 204, storage node 205, and IHSs 206A-N ("compute nodes"). In other embodiments, however, other components may be installed in rack 200.

Each of components 202-206 may be implemented by a distinct instance of IHS 100. Also, each of nodes 202-206 may be deployed at a different physical location (e.g., shelf, sled, blade, etc.) of rack enclosure 201, for example, where each location corresponds to a different vertical height.

Furthermore, one or more of IHSs 206A-N may be liquid or immersion cooled via fluid inlet 209 and outlet 210. In some embodiments, high-speed ToR 202 may facilitate the establishment of high-speed network 208 between storage node 205 and IHSs 206A-N (e.g., for workloads or applications to communicate with each other). Conversely, management switch 203 may facilitate the establishment management network 207 among head node 204, storage node 205, and BMCs 104 of IHSs 206A-N (e.g., to transmit management and telemetry data).

Figure 3:
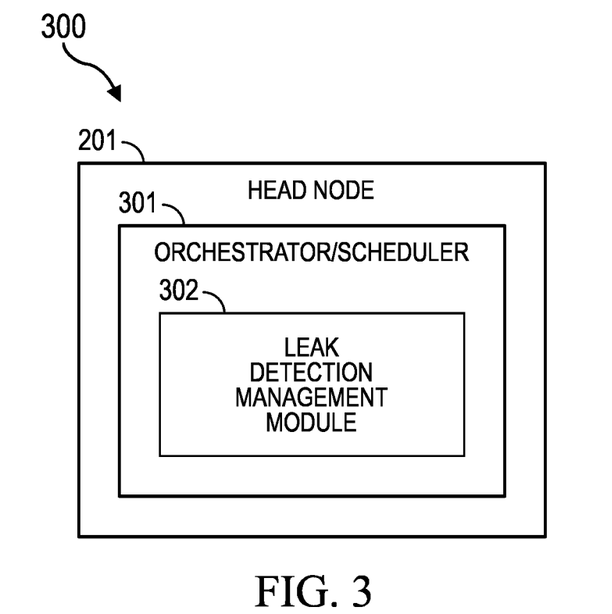
FIG. 3 is a block diagram illustrating an example of a system for rack-based management of leaks in liquid cooled IHSs, according to some embodiments.

FIG. 3 is a block diagram illustrating an example of system 300 for rack-based management of leaks in liquid cooled IHSs. Components of system 300 may be instantiated, at least in part, through the execution of program instructions stored in a memory device (e.g., memory 120) by a processor (e.g., BMC 104) of IHS 100. In some embodiments, components of system 300 may be executed by head node 204 of rack 200.

As shown in system 300, head node 201 includes orchestrator/scheduler 301 and leak detection management module 302. In various embodiments, orchestrator/scheduler 301 may be configured to manage aspects of the operation of IHSs 206A-N.

For example, orchestrator/scheduler 301 may be configured to trigger a shutdown of any of IHSs 206A-N above or below a leak reporting node, at a selected distance from the leak reporting node, at a scheduled time, etc. Additionally, or alternatively, orchestrator/scheduler 301 may be configured to trigger the migration of one or more workloads between IHSs 206A-N to another node above or below a leak reporting node, at a selected distance from a leak reporting node, etc. As used herein, the term "workload" refers to any software program or application executed by IHS 100.

Leak detection management module 302 manages a rack's response to detected leaks during the operation of liquid cooled IHSs 206A-N. For example, leak detection management module 302 may be configured to receive messages or other indications of leaks reported by IHSs 206A-N (e.g., over management network 207), aggregate them, identify a physical location of the node in enclosure 201, cause orchestrator/scheduler 301 to respond to the indication based, at least in part, upon the location, and keep a running log of leak detections.

In operation, a leak indication may be received by leak detection management module 302 over management network 207 from BMC 104 of a reporting one of compute nodes 206A-N. To determine the location of the reporting node, leak detection management module 302 may identify an Internet Protocol (IP) address of BMC 104, and it may retrieve the location of the reporting node from a table that associates the different IP addresses of different BMCs of IHSs 206A-N to different vertical locations in enclosure 201 (e.g., tray, slot number, etc.). In some cases, such a table may be gathered via management switch 203.

Figure 4:
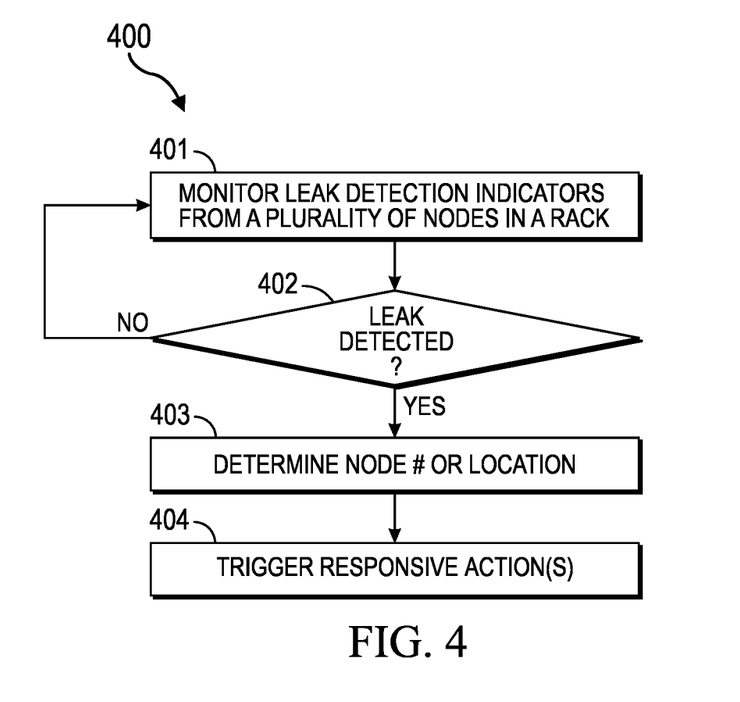
FIG. 4 is a flowchart illustrating an example of a method for rack-based management of leaks in liquid cooled IHSs, according to some embodiments.

FIG. 4 is a flowchart illustrating an example of method 400 for rack-based management of leaks in liquid cooled IHSs. In some embodiments, one or more operations of method 400 may be executed, at least in part, by one or more components of system 300, as instantiated by head node 204 of rack 200. At 401, leak detection management module 302 may monitor and/or aggregate leak detection messages or indications from IHSs 206A-N during operation of head node 204.

In some cases, a leak detection message may indicate a severity of the leak (e.g., on a scale of 1 to 5 relative to other leaks, by IHS component exposed to the leak, by number of components exposed to the leak, by an amount of leaked/leaking fluid, by a time duration of the leak, etc.). Additionally, or alternatively, the leak detection message may indicate a priority of a workload being executed by the reporting IHS (e.g., on a scale of 1 to 5 relative to other workloads, by application or type of workload, by an expected duration of execution of the workload, etc.).

At 402, if no leaks are detected in any of IHSs 206A-N, control returns to block 401. At 403, if a leak is detected by BMC 104 within a reporting one of IHSs 206A-N, leak detection management module 302 determines its IP address and consults a file or table that associates the different IP addresses of different BMCs of IHSs 206A-N to different vertical locations in enclosure 201 (e.g., tray or slot number, etc.). Leak detection management module 302 may also request that other IHSs 206A-N report their health status over management network 207. Then, at 404, leak detection management module 302 may instruct orchestrator/scheduler 301 to perform a selected one or more of a plurality of responsive actions.

In some cases, at 404, system 300 may cause head node 204 to trigger a shutdown of the reporting one of IHSs 206A-N at the identified rack location. Additionally, or alternatively, system 300 may cause head node 204 to trigger a shutdown of another one of IHSs 206A-N below the reporting one of IHSs 206A-N in rack 200. Yet additionally, or alternatively, system 300 may cause head node 204 to trigger a shutdown of a number of IHSs 206A-N below the reporting one of IHSs 206A-N in enclosure 201, and the number may be selected based, at least in part, upon the severity of the leak.

Also at 404, system 300 may cause head node 204 to trigger a migration of a workload executed by the reporting one of IHSs 206A-N to another one of IHSs 206A-N above the reporting IHS in rack 200. Additionally, or alternatively, system 300 may trigger a migration of another workload executed by the other one of IHSs 206A-N to yet another one of IHSs 206A-N. Additionally, or alternatively, system 300 may reschedule execution of the other workload.

Still at 404, system 300 may cause head node 204 to trigger a migration of a workload executed by the reporting one of the plurality of IHSs 206A-N to another one of IHSs 206A-N below the reporting IHS in enclosure 201. In some cases, the distance between another location of the other one of IHSs 206A-N and the location of the reporting one of IHSs 206A-N may be selected based, at least in part, upon a priority of the workload. Additionally, or alternatively, the distance may be selected based upon a severity of the leak. In other cases, at 404, head node 204 may trigger a migration of a workload executed by the reporting one of IHSs 206A-N to another IHS in another rack (e.g., in the same or a different datacenter).

As such, systems and methods described herein may enable the management of leak detections at the rack level. These systems and methods may include taking responsive or corrective action based on location of leak in a rack. As such, these systems and methods provide better experiences for IT administrators at a datacenter responsible for managing liquid or immersion cooled systems.

To implement various operations described herein, computer program code (i.e., program instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks. The program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation (s).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. An Information Handling System (IHS) configured as head node of a rack, the IHS comprising:
   a processor; and
   a memory coupled to the processor, the memory having program instructions stored thereon that, upon execution, cause the IHS to:
      receive an indication of a leak from a compute node, over a management network from a Baseband Management Controller (BMC) of the compute node;
      identify a location of the compute node in the rack; and
      respond to the indication based, at least in part, upon the location.

2. The IHS of claim 1, wherein the rack comprises a chassis having a plurality of compute nodes vertically stacked in trays or slots, and wherein each tray or slot comprises a different location in the rack.

3. The IHS of claim 1, wherein the compute node comprises one or more liquid-cooled or immersion-cooled components.

4. The IHS of claim 1, wherein to identify the location of the compute node, the program instructions, upon execution, further cause the IHS to:
   determine an Internet Protocol (IP) address of the BMC; and
   identify the location based, at least in part, upon a table that relates IP addresses to different rack locations.

5. The IHS of claim 1, wherein to respond to the indication, the program instructions, upon execution, further cause the IHS to trigger a shutdown of the compute node.

6. The IHS of claim 1, wherein to respond to the indication, the program instructions, upon execution, further cause the IHS to trigger a shutdown of another compute node below the compute node in the rack.

7. The IHS of claim 1, wherein to respond to the indication, the program instructions, upon execution, further cause the IHS to trigger a shutdown of a number of compute nodes below the compute node in the rack, and wherein the number is selected based, at least in part, upon a severity of the leak.

8. The IHS of claim 1, wherein to respond to the indication, the program instructions, upon execution, further cause the IHS to trigger a migration of a workload executed by the compute node to another compute node above the compute node in the rack.

9. The IHS of claim 8, wherein the program instructions, upon execution, further cause the IHS to at least one of: (a) trigger a migration of another workload executed by the other compute node to yet another compute node in the rack; or (b) reschedule execution of the other workload.

10. The IHS of claim 1, wherein to respond to the indication, the program instructions, upon execution, further cause the IHS to trigger a migration of a workload executed by the compute node to another compute node below the compute node in the rack.

11. The IHS of claim 10, wherein a distance between another location of the other compute node and the location of the compute node is selected based, at least in part, upon a priority of the workload.

12. The IHS of claim 10, wherein a distance between another location of the other compute node and the location of the compute node is selected based, at least in part, upon a severity of the leak.

13. The IHS of claim 1, wherein to respond to the indication, the program instructions, upon execution, further cause the IHS to trigger a migration of a workload executed by the compute node to another compute node in another rack.

14. In an Information Handling System (IHS) configured as head node in a rack, a method comprising:
   receiving an indication of a leak from a Baseband Management Controller (BMC) of a compute node;
   identifying a location of the compute node in the rack; and
   responding to the indication based upon the location by performing at least one of: (a) reallocating execution of a workload by the compute node to another compute node based in the rack, (b) triggering a shutdown of the compute node, (b) triggering a shutdown of another compute node below the compute node in the rack, (c) triggering a shutdown of a number of compute nodes below the compute node in the rack, (d) triggering a migration of a workload executed by the compute node to another compute node above the compute node in the rack, (e) triggering a migration of a workload executed by the compute node to another compute node below the compute node in the rack, or (f) triggering a migration of a workload executed by the compute node to another compute node in another rack.

15. The method of claim 14, wherein the other compute node is selected above the compute node in the rack.

16. The method of claim 14, wherein the other compute node is selected below the compute node in the rack, and wherein a distance between another location of the other compute node and the location of the compute node is based, at least in part, upon at least one of: a priority of the workload, or a severity of the leak.

17. A memory storage device having program instructions stored thereon that, upon execution by an Information Handling System (IHS), cause the IHS to:
- receive an indication of a leak from a compute node;
- identify a location of the compute node in the rack; and
- respond to the indication based, at least in part, upon the location, wherein at least one of: (a) the other compute node is selected above the compute node in the rack, or (b) the other compute node is selected below the compute node in the rack, and a distance between another location of the other compute node and the location of the compute node is based, at least in part, upon a priority of the workload and a severity of the leak.

* * * * *

UNITED STATES PATENT AND TRADEMARK OFFICE
CERTIFICATE OF CORRECTION

| | |
|---|---|
| PATENT NO. | : 12,133,361 B2 |
| APPLICATION NO. | : 17/812189 |
| DATED | : October 29, 2024 |
| INVENTOR(S) | : Bhavesh Govindbhai Patel |

It is certified that error appears in the above-identified patent and that said Letters Patent is hereby corrected as shown below:

In the Claims

In Column 10, Line 60, Claim 14, delete "compute node, (b) triggering a shutdown of another" and insert --compute node, (c) triggering a shutdown of another-- therefor.

In Column 10, Line 61, Claim 14, delete "compute node below the compute node in the rack, (c)" and insert --compute node below the compute node in the rack, (d)-- therefor.

In Column 10, Line 63, Claim 14, delete "below the compute node in the rack, (d) triggering a" and insert --below the compute node in the rack, (e) triggering a-- therefor.

In Column 10, Line 66, Claim 14, delete "rack, (e) triggering a migration of a workload executed" and insert --rack, (f) triggering a migration of a workload executed-- therefor.

In Column 11, Line 1, Claim 14, delete "the compute node in the rack, or (f) triggering a" and insert --the compute node in the rack, or (g) triggering a-- therefor.

Signed and Sealed this
Twenty-sixth Day of November, 2024

Katherine Kelly Vidal
*Director of the United States Patent and Trademark Office*